Feb. 11, 1969 R. W. HELDA ET AL 3,427,550

UNIT CARRIER

Filed Sept. 28, 1966

INVENTOR.
Robert W. Helda
Paul E. Scofield
BY
Mueller, Aichele & Rauner
ATTY'S.

United States Patent Office 3,427,550
Patented Feb. 11, 1969

3,427,550
UNIT CARRIER

Robert W. Helda, Scottsdale, and Paul E. Scofield, Tempe, Ariz., assignors to Motorola, Inc., Franklin Park, Ill., a corporation of Illinois Filed Sept. 28, 1966, Ser. No. 582,725
U.S. Cl. 339—36 9 Claims
Int. Cl. H01r *13/60;* B65d *85/54*

ABSTRACT OF THE DISCLOSURE

Disclosed is a carrier for a unit having a plurality of deformable leads which are insertable into a corresponding plurality of passages within the carrier and transported and electrically tested in the carrier. At least one of the passages includes a portion thereof adapted to frictionally engage one of the leads and releasably retain the unit in the carrier during transport.

This invention relates to a carrier and shipping container for units having a plurality of deformable leads, and more particularly to a carrier for semiconductor devices that protects the leads from physical damage and maintains them in a position that permits the devices to be electrically tested while retained in their carriers. This carrier also comprises an improved shipping container for the unit retained therein.

Many units, particularly semiconductor devices, have small diameter leads made of Kovar, steel or other wire that is gold plated. These leads are easily deformed or bent out of a preferred configuration during normal, required handling of the devices. Generally, when transporting the devices they are handled in bulk; i.e., packed loose in a large container. This method of handling, although expeditious, does not provide adequate protection for multilead devices, particularly those with between about 3 and 16 or more leads.

Before a device is used in a circuit, it is preferably electrically tested. To perform this testing, it is usually necessary to straighten the leads or align them in a hand operation to provide a proper lead configuration so that the device may be inserted in the test socket. A similar sequence of alignment or straightening is often necessary before inserting the device in the final circuit assembly. The operation of straightening the leads and the number of devices destroyed because of the extra handling involved, adds substantially to the cost of the devices. Also, many devices that originally tested satisfactorily cannot be utilized in circuits because of subsequent damage occurring during shipment.

A single cavity shipping package has also been used in an attempt to reduce this damage. Some two-piece carriers have been used in a further attempt to reduce the loss of devices. However, neither these or other carriers provided the desired protection for the leads along with other preferred features.

It is an object of the invention to provide a carrier comprising a unitary body incorporating the necessary requirements for effectively handling a unit having a plurality of deformable leads.

Another object of the invention is to provide a carrier for a unit that can accommodate a plurality of deformable leads and protect them from damage during handling.

A further object of the invention is to provide a carrier for a unit having a plurality of deformable leads such that the unit may be inserted, while retained in the carrier, in a socket for electrical testing while still retaining the leads in a fixed orientation and protecting them and the unit from damage.

A feature of this invention is a one-piece carrier for a unit having a region in which the leads are exposed for electrically testing the unit, yet protected from physical damage.

Another feature of this invention is a gripper integral with the carrier structure that grips at least one lead of the unit to retain the unit in the carrier.

A further feature of the invention is a tapered portion communicating between an opening into which the lead is inserted and the passage through which the lead extends in the carrier that facilitates the insertion of the lead in the carrier.

Still another feature of the invention is a carrier that supports a relatively long deformable lead over a substantial portion of its length.

The invention is embodied in a carrier for a unit with a plurality of deformable leads. This carrier comprises a unitary body with a first face including a plurality of openings communicating with passages that extend through the body. The body has a second face opposed to the first face facing away therefrom that includes a plurality of openings communicating with the passages extending through the body. At least one of these passages terminates in a gripper at the second face.

Figure 1:
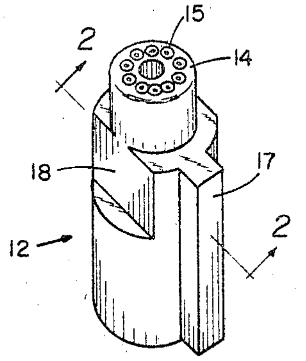
FIG. 1 is an enlarged perspective view of a carrier having a structure according to the invention.

A carrier 12 (FIG. 1) embodying the invention has a first face 14 that is substantially flat for supporting a unit with a plurality of leads. Carrier 12 has an overall cylindrical shape corresponding to the configuration of the unit to be inserted therein. First face 14 includes a plurality of circular openings 15 corresponding in position and number to the leads of the unit to be retained in carrier 12. Although the carrier shown in FIG. 1 has openings for a unit having 10 leads in a circular configuration, the shape of the carrier and the pattern of the openings may be altered so that the carrier may advantageously be used with units having between about three and 16 or more leads in a triangular, circular, rectangular or other configuration.

An orienting key 17 projects from one side of carrier 12 in a fixed relation to openings 15 that corresponds to a similar fixed position on the unit to be inserted therein. Indexes 18 in the form of two parallel flat portions on opposite sides of carrier 12 are provided for indexing the carrier in automated equipment. The shapes and positions of key 17 and indexes 18 may be varied or integrated to meet the requirements of the unit and the automated equipment used.

Figure 2:
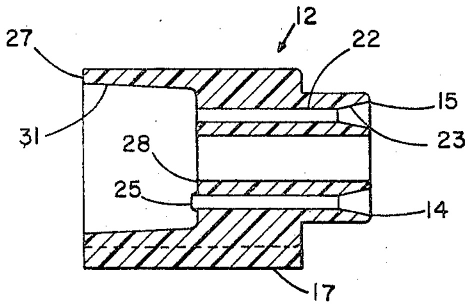
FIG. 2 is an enlarged cross-sectional view along line 2—2 of FIG. 1.

Openings 15 communicate with a corresponding plurality of passages 22 (FIG. 2) extending through the body of carrier 12. To facilitate the insertion of leads into passages 22 and reduce the possibility of physical damage thereto during this operation, passages 22 have slightly larger diameters than the leads. To further facilitate the insertion of the leads in carrier 12, openings 15 have larger diameters than passages 22 and are connected thereto by funnel-shaped transition portions 23. With devices having square, rectangular or other shaped leads, the configuration of openings 15, passages 22 and transition portion 23 would be appropriately adjusted.

The second face of carrier 12, opposite face 14, comprises a first surface 27 and a second surface 28. A wall 31 joins these surfaces and defines an open end receptacle with surface 28. At least one of passages 22 terminates at surface 28 with a gripper 25 for gripping the lead extending therethrough. Preferably, this gripper permits the ready insertion of the lead, which may vary as much as 20% in diameter or size, of a unit in carrier 12, yet holds the lead with sufficient force to prevent the accidental removal of the unit. The gripping force may be adjusted to a preselected value consistent with the handling of the unit. Surface 27 at the end of wall 31 advantageously lies within a plane surface.

Gripper 25 (FIG. 3) is a truncated cone with its base below second surface 28, and one of passages 22 extending through it symmetrical with the center line of the cone. At the narrow portion of the cone the inside diameter of passage 22 is decreased to a size slightly less than the diameter of the lead to be inserted therein. This decreased diameter portion forms a wall having a decreasing cross section that spreads readily when a lead is inserted in passage 22 through opening 15 and grips and retains the lead to hold the unit in carrier 12 when a nominal retracting force in the opposite direction is applied.

Figure 3:
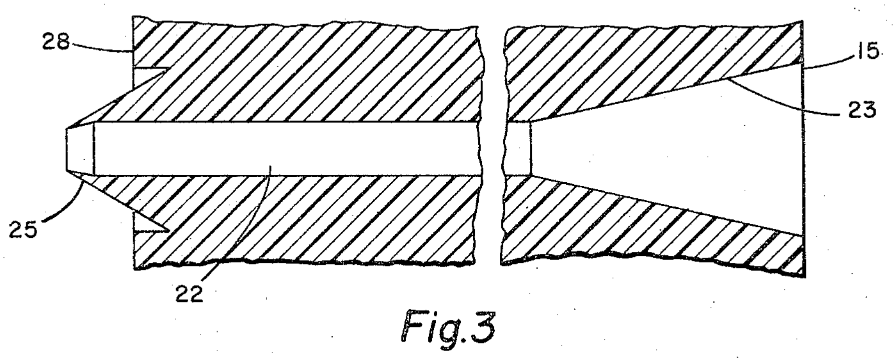
FIG. 3 is a more greatly enlarged cross-sectional view of the portion of the carrier for receiving and holding the lead of a unit.

In FIG. 3 the relative dimensions of opening 15 and passage 22 are more clearly shown. Tapered portion 23 between opening 15 and passage 22 provides a smooth and gentle transition for guiding the lead into passage 22.

Figure 4:
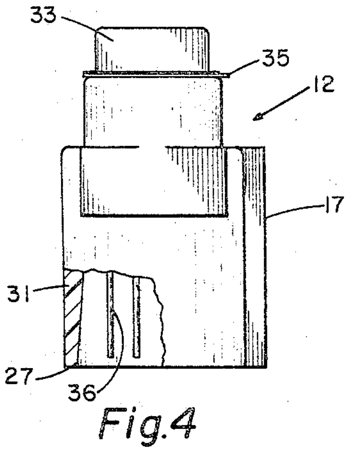
FIG. 4 is a plan view of a carrier with a section broken out and a unit inserted therein.

In FIG. 4 carrier 12 is shown with a semiconductor device 33 in a fully inserted position. The face of device 33 including the leads rests flush against face 14 of carrier 12. A positioning tab 35 on device 33 is aligned to correspond with orienting key 17, which was positioned relative to openings 15 during the fabrication of carrier 12. Leads 36 of the device extend through passages 22 of carrier 12 and can be seen in the cutaway portion extending into the open end receptacle formed by wall 31 and second surface 28. Typically, leads 36 of semiconductor device 33 have a diameter between about 0.016 and 0.019 inch. However, the carrier may be used as well with units having larger or smaller leads. The distance between face 14 and first surface 27 is greater than the length of leads 36, therefore leads 36 terminate slightly before the plane defined by first surface 27. Leads 36 are exposed within this receptacle in a suitable manner for insertion in an electrical socket.

A semiconductor device or other unit may be inserted in the carrier by a primarily hand operation. Preferably, the carrier will be used in conjunction with a lead aligning or lead straightening machine adapted for the direct insertion of the device into the carrier.

The testing of the device in the carrier is facilitated by the orienting key 17 which results in a more rapid alignment of the device in the test socket. Also, the orienting key and indexers are well suited for establishing an automated testing line and an automated assembling line, providing a probable substantial reduction in the cost of a finished item including devices so packaged.

The device, when inserted in the carrier, may be shipped in bulk or individually while still being effectively protected from physical damage to leads.

Carrier 12 is advantageously fabricated from a rigid electrical insulating material. This material should be easily formed with sufficient strength to withstand shipping and handling. Also, it is advantageous to have a material that is capable of withstanding environmental testing conditions such as temperature ranges between about −55° C. and +150° C. A thermoplastic material that may be injection molded is preferred for fabricating this carrier. Preferably, this plastic will be polysulfone, although other similar plastics such as nylon, Teflon, polyvinyl chloride, etc., may be used.

The above description and drawings show that the present invention provides a novel carrier for a multilead unit having deformable leads. Furthermore, the carrier of the invention comprises a unitary body incorporating the necessary requirements for effectively handling the unit inserted therein. Moreover, the carrier protects the leads of the unit from damage while retaining them in a suitable attitude for insertion in sockets for electrical testing.

We claim:

1. A carrier for a unit having a plurality of deformable leads, the carrier comprising a unitary body with a first face including a plurality of openings communicating with a corresponding plurality of passages extending through said body, a second face of said body opposed said first face and including a plurality of openings communicating with said passages, and a gripper integral with said body comprising a portion of at least one of said passages in proximity of said second face with a diameter that decreases to less than the dimension of said lead to be inserted therein and a wall for said portion having a tapered cross section of decreasing thickness similar in position to said decreasing diameter.

2. A carrier according to claim 4 including a plurality of transition portions joining said openings in said first face to said passages, each of said transition portions being gradually tapered between said openings in said first face and said passages to facilitate the insertion of said lead members therein.

3. A carrier according to claim 4 in which said openings have a circular configuration and taken together form a larger circle.

4. A carrier supporting a unit having a plurality of deformable leads extending into said carrier and including, in combination: a unitary body having a first face with a plurality of openings therein communicating with a plurality of passages extending through said body, said body further having a second face thereof opposed said first face and including a plurality of openings therein communicating with said passages, holding means integral with said unitary body for gripping at least one of said leads and releasably retaining said unit on said carrier, said second face comprises a first surface and a second surface, said first surface being in closer proximity to said first face and joined to said second surface by a wall, said first surface and said wall defining an open-end receptacle, said unit mounted on said first face and the deformable leads thereof extending through said passages and into said open end receptacle to a lesser axial extent than said second face, so that said open end receptacle surrounds and protects said deformable leads of said unit which is transported and electrically tested in said carrier.

5. In combination: a carrier, a unit mounted on said carrier, and a plurality of deformable leads extending into said carrier from said unit, said carrier comprising a unitary body having first and second faces between which extend a plurality of passages, said deformable leads extending through said passages with the free ends thereof projecting beyond one of said faces, at least one of said passages having a portion thereof with a dimension no greater than that of a deformable lead inserted therethrough whereby said portion of said one passage will frictionally engage said lead and releasably retain said unit in said carrier, a receptacle extending from said one face of said body to a greater axial extent than said leads, so that said receptacle surrounds and protects said leads to facilitate the electrical testing and transporting of said unit while supported by said carrier.

6. The carrier defined in claim 5 wherein said portion of said one passage includes a wall of variable thickness which is flexed by a lead passing through said portion to thereby grip said lead and releasably retain same.

7. The carrier defined in claim 5 wherein said portion comprises a wall forming part of said one passage which extends outwardly from one face of the carrier and into said receptacle, said portion having a decreasing thickness and decreasing internal diameter for permitting flexure thereof as a lead is passed therethrough in frictional engagement with said portion.

8. In combination: a carrier, a unit mounted on said carrier, and a plurality of deformable leads extending into said carrier from said unit, said carrier comprising a unitary body having first and second faces between which a plurality of passages extend, said deformable leads extending through said passages with the free ends thereof projecting beyond one of said faces, holding means integral with said unitary body for gripping at least one of said leads and releasably retaining said unit on said carrier, a receptacle portion extending from said one face of said unitary body to a greater axial extent than said leads, so that said receptacle surrounds and protects said leads to facilitate the electrical testing and transporting of said unit while supported by said carrier.

9. A carrier for supporting a unit having a plurality of deformable leads, said carrier including in combination: a unitary body having first and second faces between which a plurality of passages extend, said deformable leads of the unit adapted to extend through said passages, a receptacle portion extending from one face of said body to a greater axial extent than the leads of the unit so that the receptacle surrounds and protects said leads to facilitate the electrical testing and transporting of said unit while supported by said carrier, and holding means integral with at least one of said passages for gripping a lead and releasably retaining the unit on said carrier, said holding means comprising a wall forming a portion of said one passage, said portion extending outwardly from one face to the carrier into said receptacle, said portion having a decreasing thickness and decreasing internal diameter for permitting flexure thereof as a lead frictionally engages said portion.

References Cited

UNITED STATES PATENTS

| | | | |
|---|---|---|---|
| 2,413,041 | 12/1946 | Ferguson | 206—17 X |
| 2,810,473 | 10/1957 | Odeh et al. | 206—17 X |
| 2,817,434 | 12/1957 | Schmetz et al. | 206—66 X |
| 3,184,532 | 5/1965 | Spera | 206—46 X |
| 3,227,265 | 1/1966 | Schneider | 206—17 |
| 3,273,701 | 9/1966 | Friedman | 206—17 X |
| 2,861,250 | 11/1958 | Elwell | 206—46 XR |
| 3,090,948 | 5/1963 | Cremer | 339—38 XR |
| 2,651,025 | 9/1953 | Elliott | 339—60 X |
| 2,841,637 | 7/1958 | Moseley et al. | 174—182 X |
| 2,906,986 | 9/1959 | Schaefer | 339—60 |
| 2,963,536 | 12/1960 | Kokalas | 174—77 |
| 3,166,371 | 1/1965 | Brown et al. | 339—60 |

THERON E. CONDON, *Primary Examiner.*

U.S. Cl. X.R.

206—46